United States Patent
Lee (10) Patent No.: US 10,134,725 B2
(45) Date of Patent: Nov. 20, 2018

(54) ELECTROSTATIC DISCHARGE PROTECTION CIRCUIT APPLIED IN INTEGRATED CIRCUIT

(71) Applicant: Shenzhen Goodix Technology Co., Ltd., Shenzhen, Guangdong (CN)

(72) Inventor: Tsung-Lung Lee, Taipei (TW)

(73) Assignee: Shenzhen Goodix Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 15/813,179

(22) Filed: Nov. 15, 2017

(65) Prior Publication Data
US 2018/0090482 A1    Mar. 29, 2018

Related U.S. Application Data (63) Continuation of application No. PCT/CN2017/074450, filed on Feb. 22, 2017.

(30) Foreign Application Priority Data

Sep. 26, 2016    (WO) ................ PCT/CN2016/100109

(51) Int. Cl.
| | | |
|---|---|---|
| H02H 9/04 | (2006.01) | |
| H01L 27/02 | (2006.01) | |
| H01L 27/07 | (2006.01) | |
| H01L 29/10 | (2006.01) | |
| H01L 21/761 | (2006.01) | |

(52) U.S. Cl.
CPC ...... *H01L 27/0277* (2013.01); *H01L 27/0255* (2013.01); *H01L 27/0288* (2013.01); *H01L 27/0292* (2013.01); *H01L 27/0722* (2013.01); *H02H 9/046* (2013.01); *H01L 21/761* (2013.01); *H01L 29/1008* (2013.01); *H01L 29/1087* (2013.01)

(58) Field of Classification Search
CPC .......... H92H 9/04; H02H 9/041; H02H 9/046
USPC ........................................................ 361/56
See application file for complete search history.

(56) References Cited

U.S. PATENT DOCUMENTS

| | | | |
|---|---|---|---|
| 6,399,990 B1 | 6/2002 | Brennan | |
| 7,167,350 B2 * | 1/2007 | Salcedo-Suner | .... H01L 27/0255 257/360 |
| 7,697,249 B2 * | 4/2010 | Im | ........................ H05K 9/0067 361/111 |

(Continued)

FOREIGN PATENT DOCUMENTS

| | | |
|---|---|---|
| CN | 1649142 A | 8/2005 |
| CN | 1805142 A | 7/2006 |

(Continued)

*Primary Examiner* — Dharti Patel
(74) *Attorney, Agent, or Firm* — Winston Hsu (57) ABSTRACT

The present application provides an electrostatic discharge protection circuit including a first N-type transistor, a second N-type transistor and a high-voltage tracing circuit. The high-voltage tracing circuit includes a first input terminal, a second input terminal and an output terminal. The first input terminal is coupled to the metal pad to receive a metal pad voltage. The second input terminal receives a supply voltage. The output terminal is coupled to the second N-type transistor and configured to output a high-voltage tracing voltage, wherein the high-voltage tracing voltage is larger than or equal to the metal pad voltage.

18 Claims, 7 Drawing Sheets

(56) References Cited

U.S. PATENT DOCUMENTS

| | | | |
|---|---|---|---|
| 2003/0090845 A1* | 5/2003 | Ker | H01L 27/0262 |
| | | | 361/56 |
| 2004/0233595 A1* | 11/2004 | Ker | H01L 27/0285 |
| | | | 361/56 |
| 2006/0065932 A1 | 3/2006 | Huang | |
| 2007/0267701 A1* | 11/2007 | Sung | H01L 27/0266 |
| | | | 257/365 |
| 2009/0086394 A1 | 4/2009 | Yasuda | |
| 2009/0135534 A1* | 5/2009 | Ishii | H01L 27/0251 |
| | | | 361/56 |
| 2010/0148266 A1 | 6/2010 | Foley | |
| 2011/0176245 A1 | 7/2011 | Worley | |
| 2013/0099297 A1* | 4/2013 | He | H01L 27/0285 |
| | | | 257/296 |

FOREIGN PATENT DOCUMENTS

| | | |
|---|---|---|
| CN | 101030574 A | 9/2007 |
| CN | 101192606 A | 6/2008 |
| CN | 101192753 A | 6/2008 |

* cited by examiner

ELECTROSTATIC DISCHARGE PROTECTION CIRCUIT APPLIED IN INTEGRATED CIRCUIT

CROSS REFERENCE TO RELATED APPLICATIONS

The present application is a continuation of international application No. PCT/CN2017/074450, filed on Feb. 22, 2017, which claims the priority to international application No. PCT/CN2016/100109, filed on Sep. 26, 2016, both of which are incorporated herein by reference in its entirety.

FIELD OF THE INVENTION

The present invention relates to an electrostatic discharge (ESD) protection circuit, and more particularly, to an ESD protection circuit capable of preventing leakage current.

BACKGROUND

As electronic technology evolves, electronic devices are applied in a wider area. Electronic devices are not only applied in high technology area such as aerospace equipment, but also applied in consumer electronic products, such as home appliances, communication devices, medical equipment, etc. Electro static discharge (ESD) is everywhere, and ESD problem is a threat for normal operation of equipment. It is an issue of engineer thinking about how to prevent ESD such that the device operates normally. ESD happens usually in real life, especially when the electronic device is manufactured, transported, stored and in usage. When the electrostatic is accumulated to a certain level, energy of a certain degree would be released, which causes irreversible damage on the electronic device.

The ESD protection circuit in the art has unavoidable leakage current, which increases overall power consumption of the integrated circuit (IC). Therefore, how to prevent leakage current is a significant objective in the field.

SUMMARY

It is therefore a primary objective of embodiments of the present application to provide an ESD protection circuit capable of preventing leakage current.

To solve the problem stated in the above, the present application provides an ESD protection circuit, including a first N-type transistor including a first gate terminal, coupled to a ground terminal; a first electrode terminal, coupled to the first gate terminal; and a second electrode terminal; a second N-type transistor including a second gate terminal, coupled to a metal pad; a third electrode terminal, coupled to the second gate terminal; a fourth electrode terminal, coupled to the second electrode terminal; and a fifth electrode terminal; and a high-voltage tracing circuit including a first input terminal, coupled to the metal pad, receiving a metal pad voltage; a second input terminal, receiving a supply voltage; and an output terminal, coupled to the fifth electrode terminal, configured to output a high-voltage tracing voltage, wherein the high-voltage tracing voltage is larger than or equal to the metal pad voltage.

For example, the high-voltage tracing circuit includes a first transistor including a first control terminal, coupled to the second input terminal; a first terminal, coupled to the first input terminal; and a second terminal, coupled to the output terminal; and a second transistor including a second control terminal, coupled to the first input terminal; a third terminal, coupled to the second input terminal; and a fourth terminal, coupled to the output terminal.

For example, when the metal pad voltage is larger than the supply voltage, the first transistor is conducted and the second transistor is cutoff.

For example, when the metal pad voltage is less than the supply voltage, the first transistor is cutoff and the second transistor is conducted.

For example, the high-voltage tracing circuit further includes a diode, coupled between the first input terminal and the first terminal of the first transistor.

For example, the first N-type transistor further includes a first base terminal, coupled to the first electrode terminal.

For example, the second N-type transistor includes a first deep N-well, disposed under the third electrode terminal, the fourth electrode terminal and the fifth electrode terminal.

For example, the second N-type transistor further includes a first P-well, disposed between the third electrode terminal, the fourth electrode terminal and the first deep N-well.

For example, the second N-type transistor further includes a first N-well, and the first N-well is disposed by a side of the first P-well.

For example, the N-type region is formed as the fifth electrode terminal.

For example, when a metal pad voltage of the metal pad is a positive ESD voltage, a first current flows to the ground terminal through the first N-type transistor.

For example, when a metal pad voltage of the metal pad is a positive ESD voltage, the first N-type transistor is formed as a first bipolar transistor.

For example, when a metal pad voltage of the metal pad is a negative ESD voltage, a second current flows to the metal pad through the second N-type transistor.

For example, when a metal pad voltage of the metal pad is a negative ESD voltage, the second N-type transistor is formed as a second bipolar transistor.

For example, the high-voltage tracing voltage is a maximum voltage of the metal pad voltage and the supply voltage.

For example, the ESD protection circuit further includes a diode, coupled between the fifth electrode terminal of the second N-type transistor and the output terminal of the high-voltage tracing circuit.

For example, the diode includes a first terminal, coupled to the fifth electrode terminal of the second N-type transistor; and a second terminal, coupled to the output terminal of the high-voltage tracing circuit.

For example, the diode includes a second N-well, disposed under the first terminal and the second terminal.

For example, the diode includes a second P-well, disposed under the first terminal and the second terminal.

For example, the diode further includes a second deep N-well, disposed under the second P-well.

For example, the ESD protection circuit further includes a plurality of diodes, formed as a diode series; wherein the diode series is coupled between the fifth electrode terminal of the second N-type transistor and the output terminal of the high-voltage tracing circuit.

The ESD protection circuit provided by the present application utilizes the high-voltage tracing circuit to avoid the leakage current, and has advantages of small circuit area and low power consumption.

BRIEF DESCRIPTION OF THE DRAWINGS

One or more exemplary embodiments illustrated by the drawings of the corresponding images, which illustrate exemplary embodiments does not constitute a limited, elements the same reference numerals in the figures of the drawings denote like elements having, unless otherwise stated, the accompanying drawings do not constitute a limit thereon.

DETAILED DESCRIPTION

In order to make the objects, technical solutions and advantages of the present invention become more apparent, the following relies on the accompanying drawings and embodiments to describe the present invention in further detail. It should be understood that the specific embodiments described herein are only for explaining the present invention and are not intended to limit the present invention.

Figure 1:
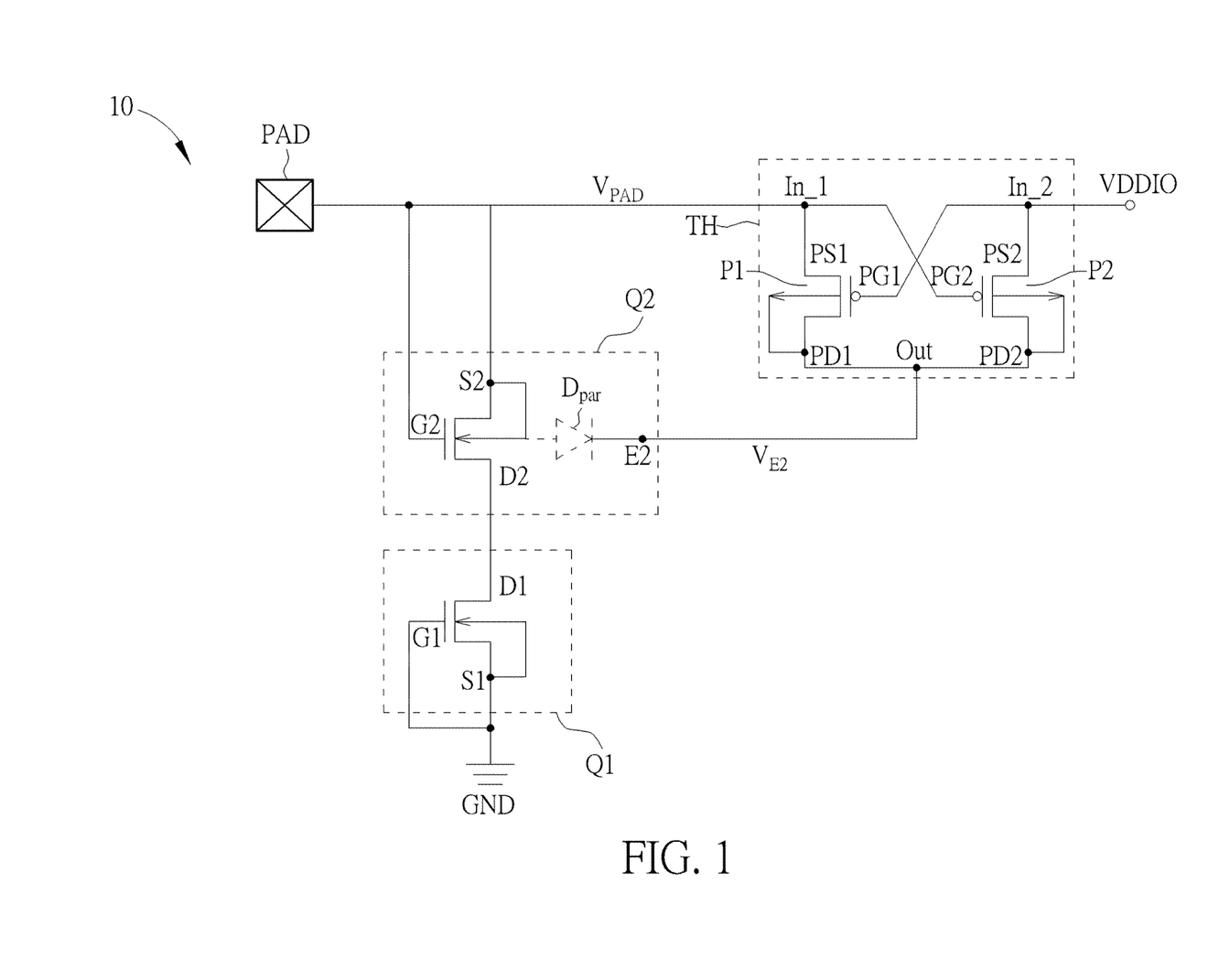
FIG. 1 is a schematic diagram of an electrostatic discharge (ESD) protection circuit according to an embodiment of the present application.
Figure 2:
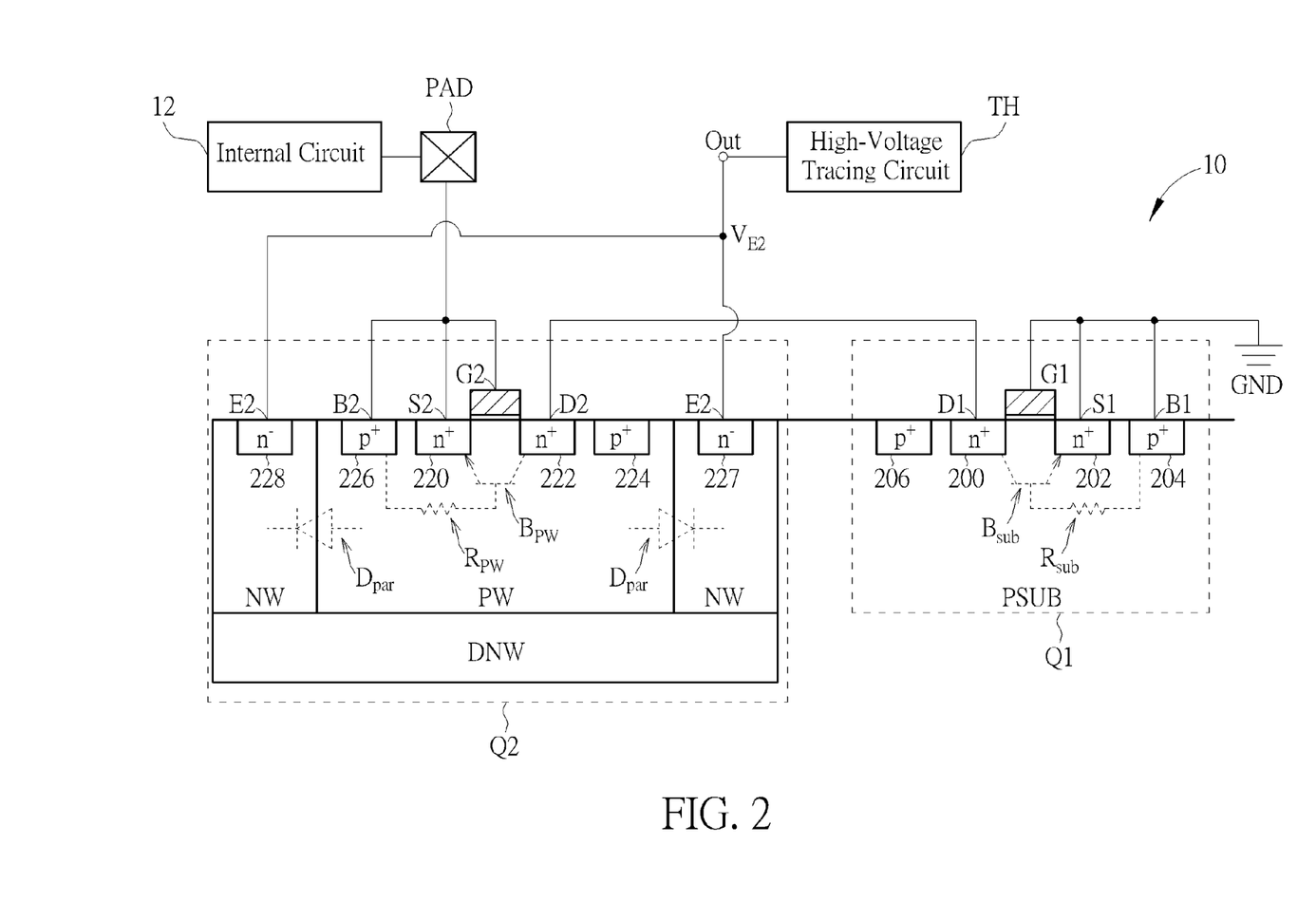
FIG. 2 is a sectional side view of circuit layout regarding a first N-type transistor and a second N-type transistor within the ESD protection circuit illustrated in FIG. 1.

Please refer to FIG. 1 and FIG. 2. FIG. 1 is a schematic diagram of an electrostatic discharge (ESD) protection circuit 10 according to an embodiment of the present invention. FIG. 2 is a sectional side view of circuit layout regarding a first N-type transistor Q1 and a second N-type transistor Q2. The ESD protection circuit 10 includes the first N-type transistor Q1, the second N-type transistor Q2 and a high-voltage tracing circuit TH. The first N-type transistor Q1 includes a gate terminal G1 and electrode terminals S1 and D1. The second N-type transistor Q2 includes a gate terminal G2 and electrode terminals S2, D2 and E2. The gate terminal G1 and the electrode terminal S1 are coupled to a ground terminal GND. The gate terminal G2 and the electrode terminal S2 are coupled to a metal pad PAD. The electrode terminal D1 of the first N-type transistor Q1 is coupled to the electrode terminal D2 of the second N-type transistor. The high-voltage tracing circuit TH has input terminals In_1 and In_2 and an output terminal Out. The input terminal In_1 is coupled to the metal pad PAD, configured to receive a metal pad voltage VPAD. The input terminal In_2 is configured to receive a supply voltage VDDIO. The output terminal Out is coupled to the electrode terminal E2 of the second N-type transistor Q2, configured to output a high-voltage tracing voltage VE2, wherein the high-voltage tracing voltage VE2 is larger than or equal to the metal pad voltage VPAD.

Specifically, as shown in FIG. 2, the first N-type transistor Q1 is formed on a P-type substrate PSUB. That is, the N-type regions 200, 202 and the P-type regions 204, 206 are formed on the P-type substrate PSUB. The N-type region 200 may be formed as the electrode terminal D1 of the first N-type transistor Q1. The N-type region 202 may be formed as the electrode terminal S1 of the first N-type transistor Q1. An oxide layer and a poly silicon layer, disposed between the N-type region 200 and the N-type region 202, are formed as the gate terminal G1 of the first N-type transistor Q1. In addition, the P-type region 204 may be formed as a base terminal B1 of the first N-type transistor Q1. The gate terminal G1, the electrode terminal S1 and the base terminal B1 of the first N-type transistor Q1 are all coupled to the ground terminal GND.

In addition, the second N-type transistor Q2 includes a deep N-well DNW, a P-well PW, N-wells NW, N-type regions 220, 222, 227 and 228 and P-type regions 224 and 226. The P-well PW and the N-wells NW are both formed on the deep N-well DNW. The N-wells NW are disposed by two sides of the P-well PW. The N-type regions 220, 222 and the P-type regions 224 and 226 are formed on the P-well PW. The N-type regions 227 and 228 are formed on the N-wells NW. Similarly, the N-type region 220 may be formed as the electrode terminal S2 of the second N-type transistor Q2, and the N-type region 222 may be formed as the electrode terminal D2 of the second N-type transistor Q2. An oxide layer and a poly silicon layer, disposed between the N-type region 220 and the N-type region 222, are formed as the gate terminal G2 of the second N-type transistor Q2. In addition, the P-type region 226 may be formed as abase terminal B2 of the second N-type transistor Q2. The gate terminal G2, the electrode terminal S2 and the base terminal B2 of the second N-type transistor Q2 are all coupled to the metal pad PAD. In addition, the N-type regions 227 and 228 are formed as the electrode terminal E2 of the second N-type transistor Q2, and coupled to the output terminal Out of the high-voltage tracing circuit TH.

Notably, junctions between the P-well PW of the second N-type transistor Q2 and the N-well NW would form parasitic diodes Dpar. When the forward bias between the P-well PW and the N-wells NW is too large, it is equivalent that the parasitic diodes Dpar are conducted, and leakage current from the P-well PW to the N-wells NW is generated.

To solve the leakage current problem, the high-voltage tracing circuit TH may output the high-voltage tracing voltage VE2 which is larger than or equal to the metal pad voltage VPAD, to prevent the leakage current. Specifically, the high-voltage tracing circuit TH includes a first transistor P1 and a second transistor P2. In an embodiment, the first transistor P1 and the second transistor P2 are all PMOS. A gate PG1 of the first transistor P1 is coupled to the input terminal In_2 to receive the supply voltage VDDIO. A source PS1 of the first transistor P1 is coupled to the input terminal In_1 to receive the metal pad voltage VPAD. A gate PG2 of the second transistor P2 is coupled to the input terminal In_1 to receive the metal pad voltage VPAD. A source PS2 of the second transistor P2 is coupled to the input terminal In_2 to receive the supply voltage VDDIO, a drain PD1 of the first transistor P1 and a drain PD2 of the second transistor P2 are both coupled to the electrode terminal E2 of the second N-type transistor Q2. Ignoring a threshold voltage Vth of the first transistor P1 and the second transistor P2, when the metal pad voltage VPAD is larger than the supply voltage VDDIO, the first transistor P1 is conducted and the second transistor P2 is cutoff. At this time, the high-voltage tracing circuit TH outputs the high-voltage tracing voltage VE2 as the metal pad voltage VPAD to the electrode terminal E2 of the second N-type transistor Q2. On the other hand, when the metal pad voltage VPAD is less than the supply voltage VDDIO, the first transistor P1 is cutoff and the second transistor P2 is conducted. At this time, the high-voltage tracing circuit TH outputs the high-voltage tracing voltage VE2 as the supply voltage VDDIO to the electrode terminal E2 of the second N-type transistor Q2. In other words, the high-voltage tracing voltage VE2 outputted by the high-voltage tracing circuit TH is a maximum voltage of the metal pad voltage VPAD and the supply voltage VDDIO, i.e., VE2=max(VPAD, VDDIO). It implies that, the high-voltage tracing voltage VE2 outputted by the high-voltage tracing circuit TH is larger than or equal to the metal pad voltage VPAD. In this case, the junctions between the P-well PW of the second N-type transistor Q2 and the N-wells NW would hardly have sufficient forward bias, or the forward bias is insufficient. The parasitic diodes Dpar are rarely conducted, which solves the leakage current problem between the P-well PW and the N-wells NW.

In addition, an internal circuit 12, protected by the ESD protection circuit 10, is coupled to the metal pad PAD, where the metal pad PAD, the ESD protection circuit 10 and the internal circuit 12 may be integrated in an integrated circuit (IC). Under a normal operation condition, i.e., when a voltage difference between the metal pad PAD and the ground terminal GND is substantially the supply voltage VDDIO of the IC, a loop from the metal pad PAD to the ground terminal GND is cutoff. When an extremely high voltage exists between the metal pad PAD and the ground terminal GND, e.g., ESD Zap, or during ESD testing, a current path within the ESD protection circuit 10 from the metal pad PAD to the ground terminal GND may be formed, which means that the loop from the metal pad PAD to the ground terminal GND is conducted, so as to prevent the extremely high voltage and its current has impact on the internal circuit 12, e.g., damages the internal circuit 12.

Specifically, under a normal operation condition, when the metal pad voltage VPAD of the metal pad PAD is substantially the supply voltage VDDIO, the second N-type transistor Q2 is conducted and the first N-type transistor Q1 is cutoff. When the metal pad voltage VPAD is substantially negative of the supply voltage, i.e., −VDDIO, the second N-type transistor Q2 is cutoff and the first N-type transistor Q1 is conducted. In other words, under the normal operation condition, the loop between the metal pad PAD and the ground terminal GND is cutoff.

On the other hand, when ESD Zap occurs or it is during ESD testing, the first N-type transistor Q1 (or the second N-type transistor Q2) is equivalent to a bipolar transistor and the current path is formed, which is to prevent the internal circuit 12 from being damaged. Specifically, when the metal pad voltage VPAD receives a positive ESD voltage, e.g., VPAD=2 kilovolt (KV), the second N-type transistor Q2 is conducted, and the P-type substrate PSUB of the first N-type transistor Q1 and the N-type regions 200, 202 form a bipolar transistor Bsub and an equivalent resistance Rsub. Hence, a current may flow from the metal pad PAD to the ground terminal GND. On the other hand, when the metal pad voltage VPAD receives a negative ESD voltage, e.g., VPAD=−2 KV, the first N-type transistor Q1 is conducted, and the P-well PW of the second N-type transistor Q2 and the N-type regions 220, 222 forms a bipolar transistor BPW and an equivalent resistance RPW. Hence, a current may flow from the ground terminal GND to the metal pad PAD. In other words, when there is an extremely high voltage existing between the metal pad PAD and the ground terminal GND, the originally cutoff first N-type transistor Q1 (or the originally cutoff second N-type transistor Q2) may form as the bipolar transistor Bsub (or the bipolar transistor BPW), and the current path between the metal pad PAD and the ground terminal GND is formed, such that the loop through the metal pad PAD and the ground terminal GND is conducted in time, so as to prevent excessive current from flowing to the internal circuit 12 and damaging the internal circuit 12.

As can be seen, the ESD protection circuit 10 utilizes the high-voltage tracing circuit TH to provide the high-voltage tracing voltage VE2 which is larger than the metal pad voltage VPAD to the electrode terminal E2 of the second N-type transistor Q2. Hence, the ESD protection circuit 10 would not have the leakage current flowing from the P-well PW to the N-well NW.

Figure 3:
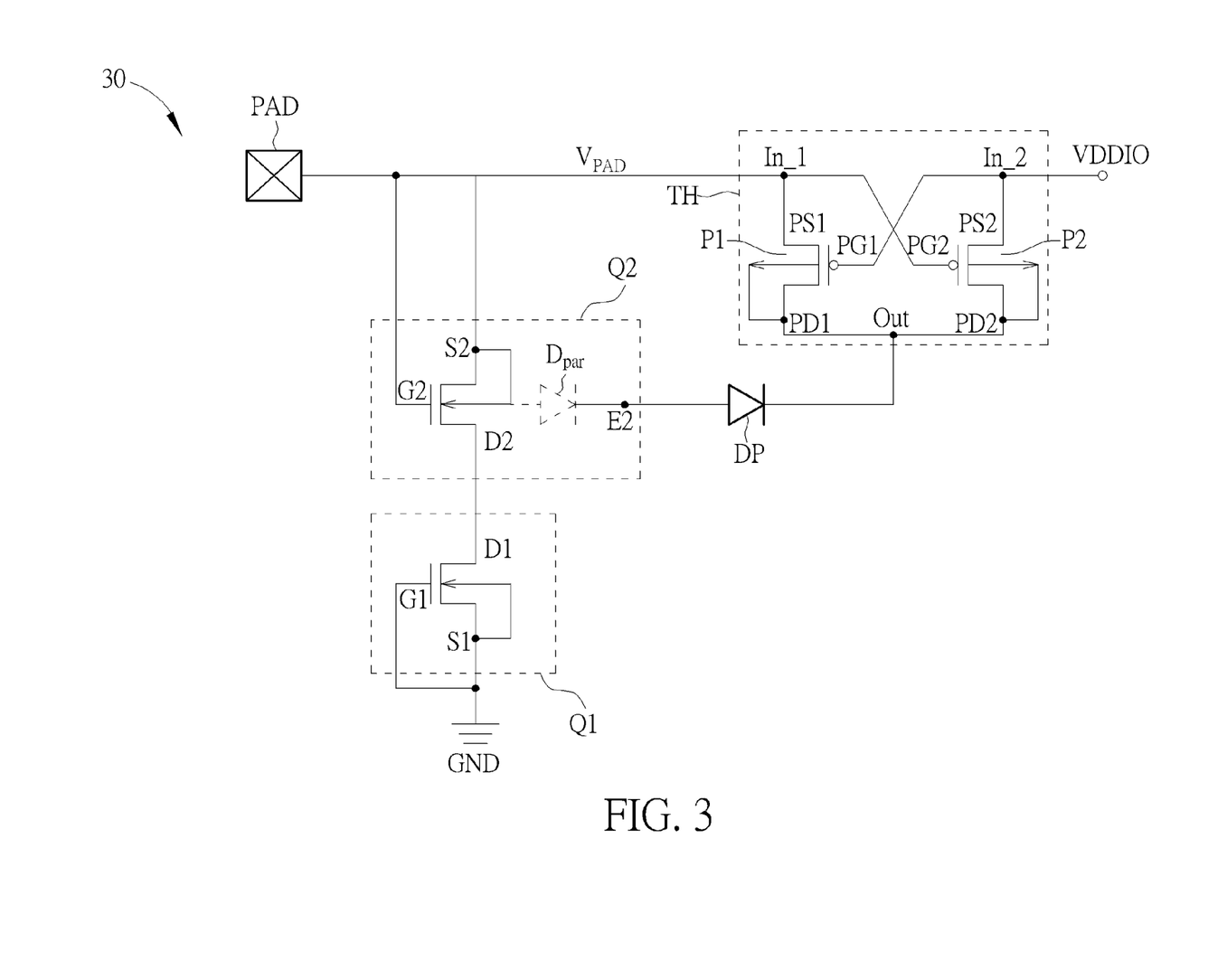
FIG. 3 is a schematic diagram of an ESD protection circuit according to an embodiment of the present application.
Figure 4:
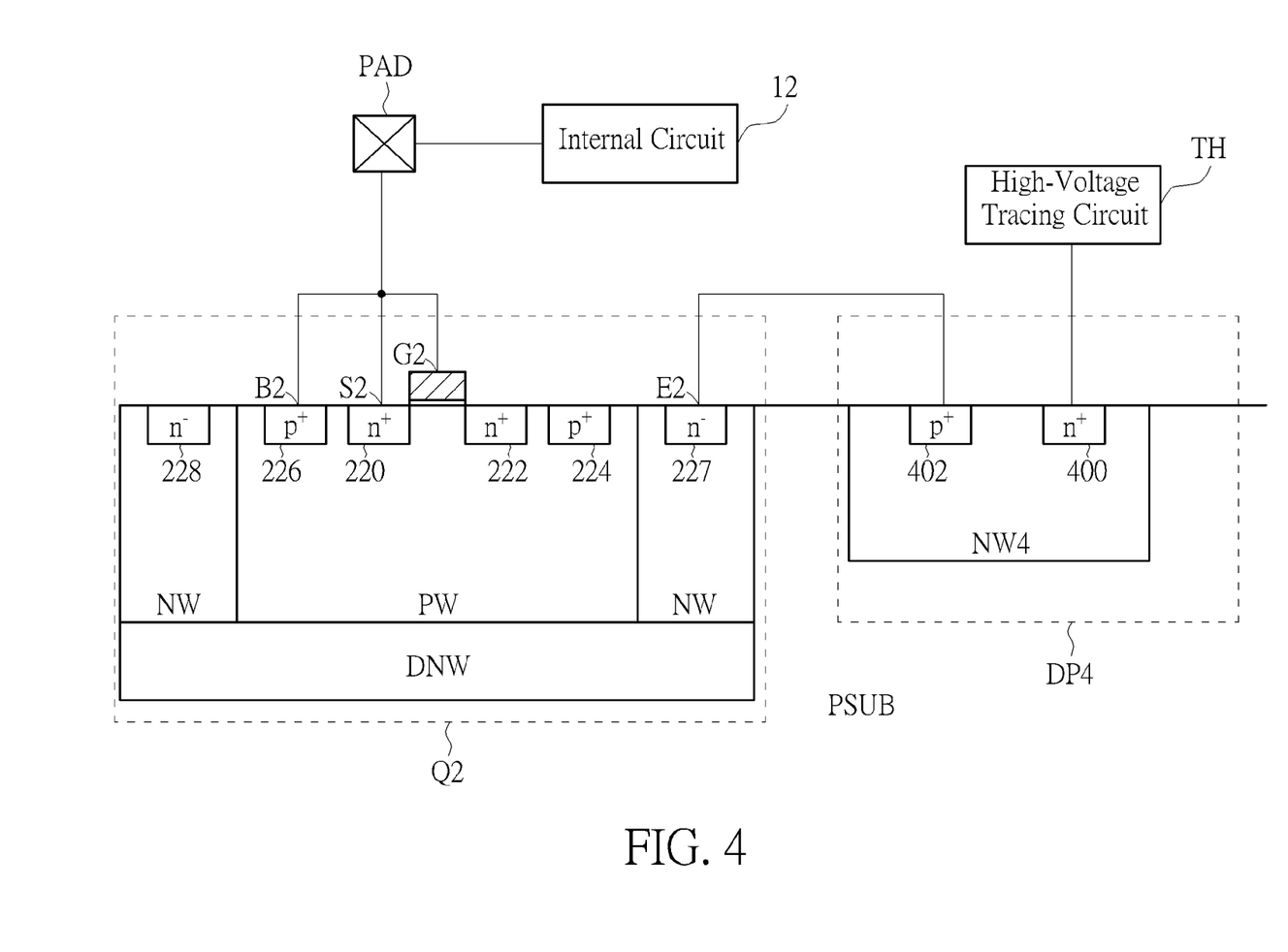
FIG. 4 is a sectional side view of circuit layout regarding a second N-type transistor and a diode within the ESD protection circuit illustrated in FIG. 3.
Figure 5:
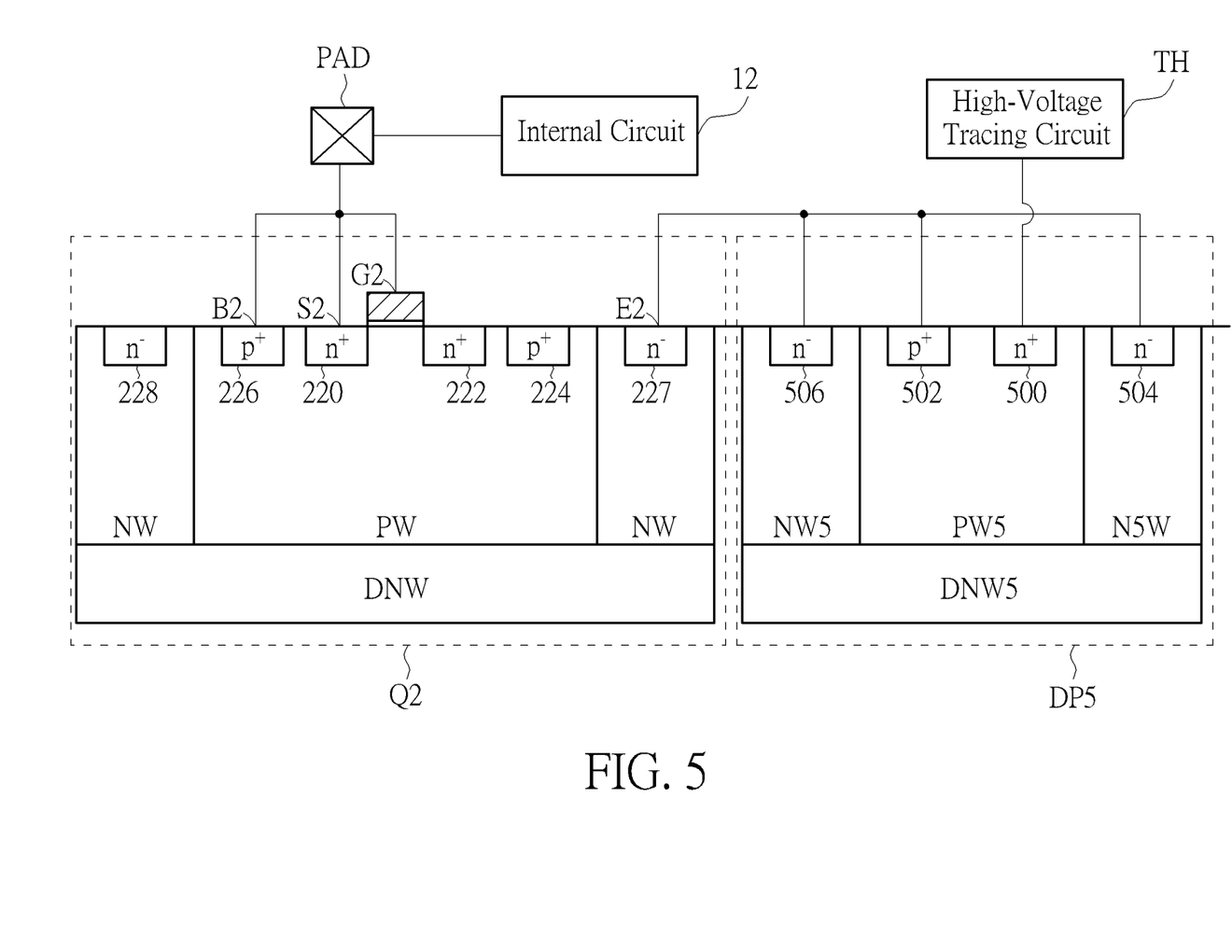
FIG. 5 is a sectional side view of circuit layout regarding the second N-type transistor and a diode within the ESD protection circuit illustrated in FIG. 3.

Notably, the embodiments stated in the above are utilized for illustrating the concept of the present application. Those skilled in the art may make modifications and alterations accordingly, and not limited herein. For example, please refer to FIG. 3, which is a schematic diagram of an ESD protection circuit 30 according to an embodiment of the present application. The ESD protection circuit 30 is similar to the ESD protection circuit 10, and thus, the same components are denoted by the same notations. Different from the ESD protection circuit 10, the ESD protection circuit 30 further includes a diode DP. The diode DP is coupled between the electrode terminal E2 of the second N-type transistor Q2 and the output terminal Out of the high-voltage tracing circuit TH. When the metal pad voltage VPAD is negative, the diode DP may be utilized to prevent junction breakdown between the N-well NW and the P-well PW (or the deep N-well DNW and the P-well PW) within the second N-type transistor Q2. Please refer to FIG. 4 to see the detail connection between the second N-type transistor Q2 and the diode DP. FIG. 4 is a sectional side view of circuit layout regarding the second N-type transistor Q2 and a diode DP4. The diode DP4 may be utilized to realize the diode DP in FIG. 3. As FIG. 4 shows, the diode DP4 may be formed in the P-type substrate PSUB. The diode DP4 includes an N-well NW4, an N-type region 400 and a P-type region 402, where the N-type region 400 and the P-type region 402 are formed in the N-well NW4. The N-type region 400 is coupled to the output terminal Out of the high-voltage tracing circuit TH, and the P-type region 402 is coupled to the N-type region 227/the electrode terminal E2 of the second N-type transistor Q2. In addition, the diode DP in FIG. 3 is not limited to be realized by using the diode DP4 in FIG. 4. For example, please refer to FIG. 5, which is a sectional side view of circuit layout regarding the second N-type transistor Q2 and a diode DP5. The diode DP5 may also be utilized to realize the diode DP in FIG. 3. Different from the diode DP4, the diode DP5 includes a deep N-well DNW5, a P-well PW5, N-wells NW5, N-type regions 500, 504, 506 and a P-type region 502. The P-well PW5 and the N-wells NW5 are both formed on the deep N-well DNW5. The N-wells NW5 are disposed by two sides of the P-well PW5. In addition, the N-type region 500 and the P-type region 502 are formed on the P-well PW5. The N-type regions 504 and 506 are formed on the N-well NW5. The N-type regions 504, 506 and the P-type region 502 are coupled to the N-type region 227/the electrode terminal E2 of the second N-type transistor Q2. The N-type region 500 is coupled to the output terminal Out of the high-voltage tracing circuit TH.

Figure 6:
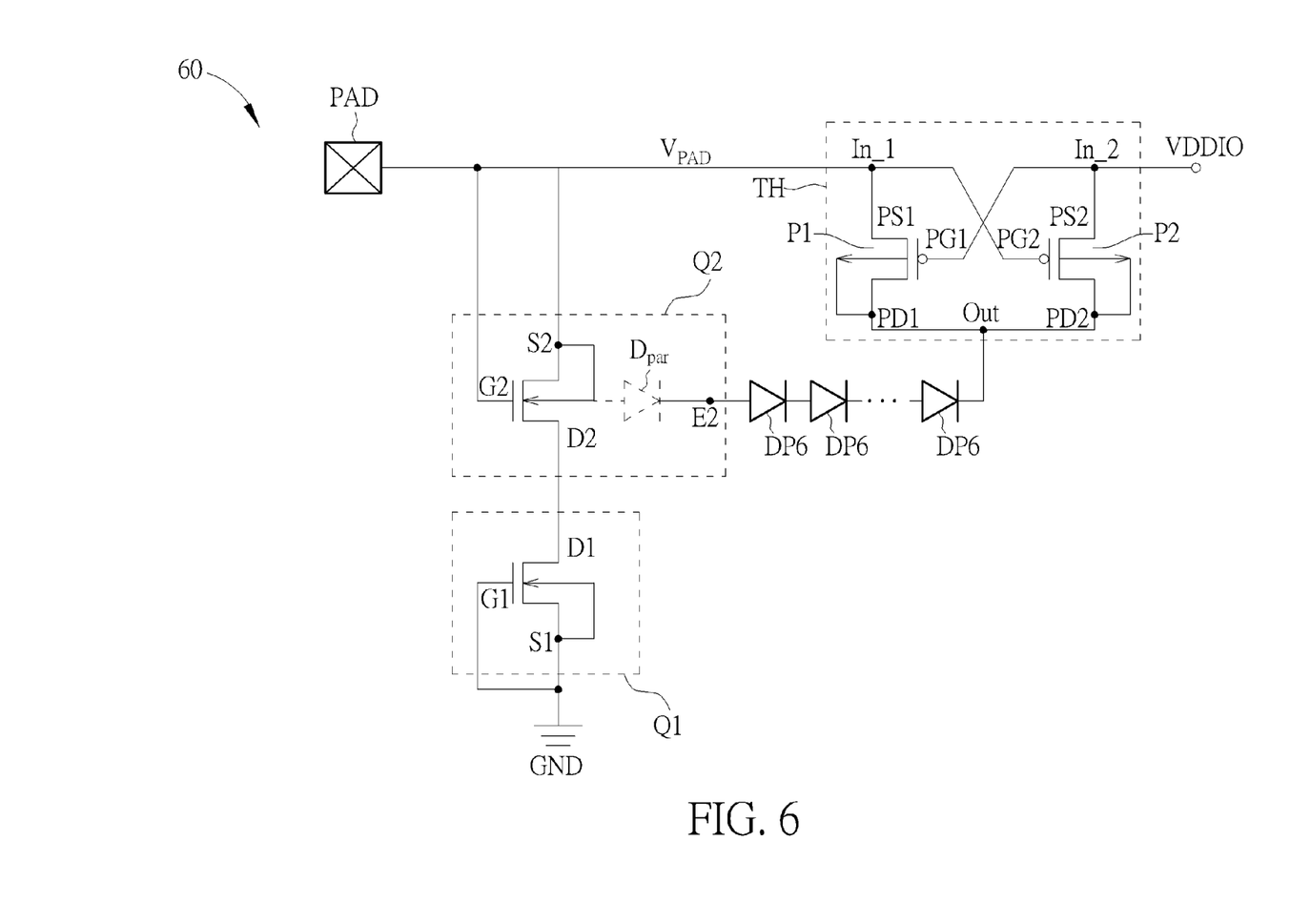
FIG. 6 is a schematic diagram of an ESD protection circuit according to an embodiment of the present application.

In addition, please refer to FIG. 6, which is a schematic diagram of an ESD protection circuit 60 according to an embodiment of the present application. The ESD protection circuit 60 is similar to the ESD protection circuit 30, and thus, the same components are denoted by the same notations. Different from the ESD protection circuit 30, the ESD protection circuit 60 comprises a plurality of diodes DP6. The plurality of diodes DP6 are connected in series to form as a diode series, and the diode series is coupled between the electrode terminal E2 of the second N-type transistor Q2 and the output terminal Out of the high-voltage tracing circuit TH, which is also within the scope of the present application.

Figure 7:
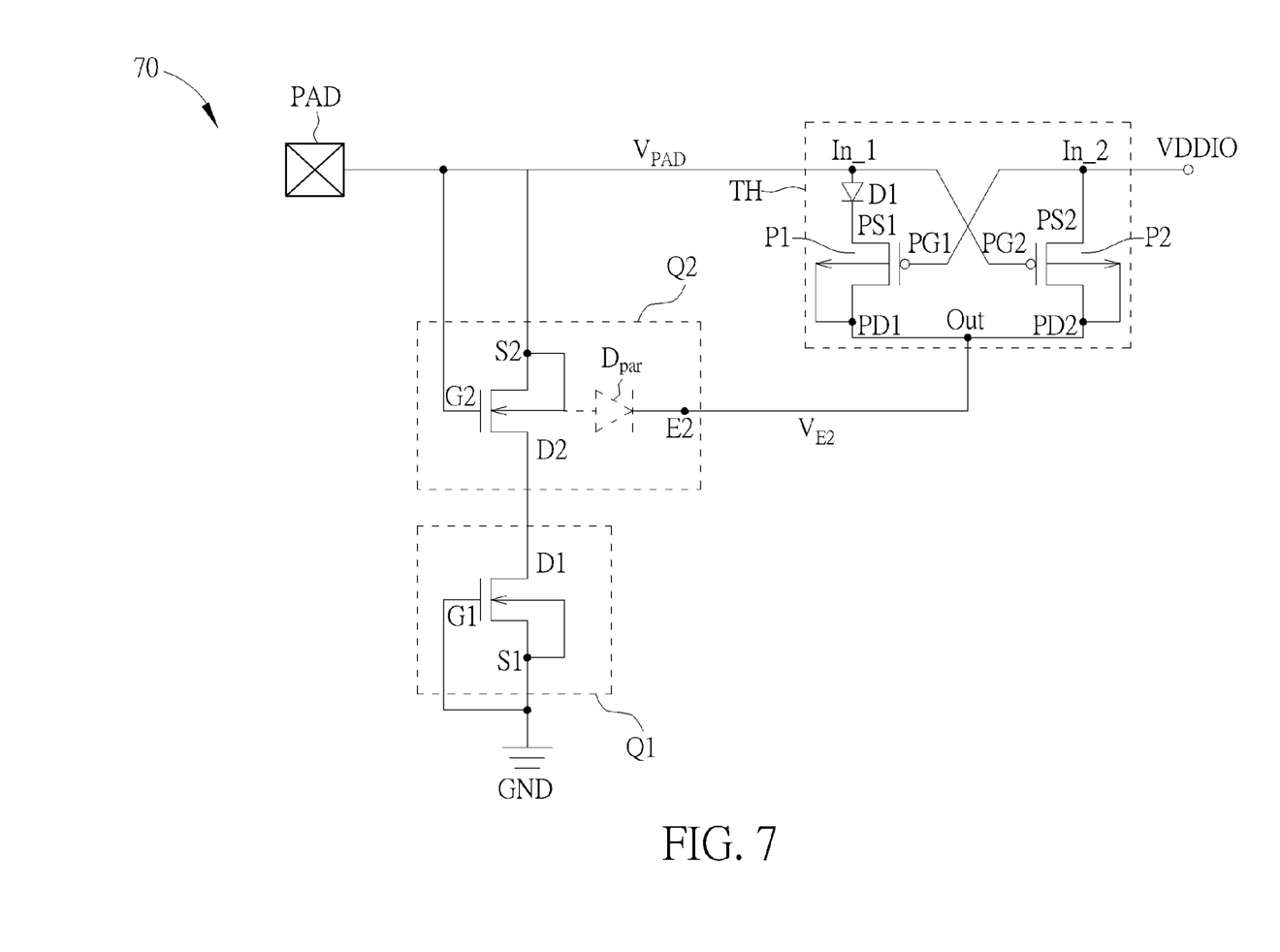
FIG. 7 is a schematic diagram of an ESD protection circuit according to an embodiment of the present application.

In addition, please refer to FIG. 7, which is a schematic diagram of an ESD protection circuit 70 according to an embodiment of the present application. The ESD protection circuit 70 is similar to the ESD protection circuit 10, and thus, the same components are denoted by the same notations. Different from the ESD protection circuit 10, the high-voltage tracing circuit TH of the ESD protection circuit 70 further includes a diode D1. The diode D1 is configured to protect the first transistor P1, so as to prevent the first transistor P1 from damage caused by excessive voltage, especially when the metal pad voltage VPAD is negative of the supply voltage VDDIO, i.e., VPAD=−VDDIO.

In summary, the ESD protection circuit of the present application utilizes the high-voltage tracing circuit to provide the high-voltage tracing voltage larger than the metal pad voltage to the electrode terminal of the second N-type transistor Q2. Thus, the ESD protection circuit may avoid the leakage current from the P-well to the N-wells.

The foregoing is only embodiments of the present application it is preferred not intended to limit the present application, those skilled in the art, the present application may have various changes and variations. Any modification within the spirit and principle of the present application, equivalent substitutions, improvements should be included within the scope of the present invention.

What is claimed is:

1. An electrostatic discharge (ESD) protection circuit, comprising:
   a first N-type transistor, comprising:
      a first gate terminal, coupled to a ground terminal;
      a first electrode terminal, coupled to the first gate terminal; and
      a second electrode terminal;
   a second N-type transistor, comprising:
      a second gate terminal, coupled to a metal pad;
      a third electrode terminal, coupled to the second gate terminal;
      a fourth electrode terminal, coupled to the second electrode terminal; and
      a fifth electrode terminal; and
   a high-voltage tracing circuit, comprising:
      a first input terminal, coupled to the metal pad and configured to receive a metal pad voltage;
      a second input terminal, configured to receive a supply voltage; and
      an output terminal, coupled to the fifth electrode terminal, configured to output a high-voltage tracing voltage, wherein the high-voltage tracing voltage is larger than or equal to the metal pad voltage.

2. The ESD protection circuit as claim 1, wherein the high-voltage tracing circuit comprises:
   a first transistor, comprising:
      a first control terminal, coupled to the second input terminal;
      a first terminal, coupled to the first input terminal; and
      a second terminal, coupled to the output terminal; and
   a second transistor, comprising:
      a second control terminal, coupled to the first input terminal;
      a third terminal, coupled to the second input terminal; and
      a fourth terminal, coupled to the output terminal.

3. The ESD protection circuit as claim 2, wherein when the metal pad voltage is larger than the supply voltage, the first transistor is conducted and the second transistor is cutoff; or when the metal pad voltage is less than the supply voltage, the first transistor is cutoff and the second transistor is conducted.

4. The ESD protection circuit as claim 2, wherein the high-voltage tracing circuit further comprises:
   a diode, coupled between the first input terminal and the first terminal of the first transistor.

5. The ESD protection circuit as claim 1, wherein the first N-type transistor further comprises:
   a first base terminal, coupled to the first electrode terminal.

6. The ESD protection circuit as claim 1, wherein the second N-type transistor comprises:
   a first deep N-well, disposed under the third electrode terminal, the fourth electrode terminal and the fifth electrode terminal.

7. The ESD protection circuit as claim 6, wherein the second N-type transistor further comprises a first P-well, disposed between the third electrode terminal, the fourth electrode terminal and the first deep N-well.

8. The ESD protection circuit as claim 7, wherein the second N-type transistor further comprises a first N-well, and the first N-well is disposed by a side of the first P-well.

9. The ESD protection circuit as claim 8, wherein the second N-type transistor further comprises an N-type region, the N-type region is disposed in the first N-well and is formed as the fifth electrode terminal.

10. The ESD protection circuit as claim 1, wherein:
   when a metal pad voltage of the metal pad is a positive ESD voltage, a first current flows to the ground terminal through the first N-type transistor or the first N-type transistor is formed as a first bipolar transistor; or
   when a metal pad voltage of the metal pad is a negative ESD voltage, a second current flows to the metal pad through the second N-type transistor, or the second N-type transistor is formed as a second bipolar transistor.

11. The ESD protection circuit as claim 10, wherein the positive ESD voltage is larger than 1 kilovolt, or the negative ESD voltage is less than negative 1 kilovolt.

12. The ESD protection circuit as claim 1, wherein the high-voltage tracing voltage is a maximum voltage of the metal pad voltage and the supply voltage.

13. The ESD protection circuit as claim 1, further comprising:
   a diode, coupled between the fifth electrode terminal of the second N-type transistor and the output terminal of the high-voltage tracing circuit.

14. The ESD protection circuit as claim 13, wherein the diode comprises:
   a first terminal, coupled to the fifth electrode terminal of the second N-type transistor; and
   a second terminal, coupled to the output terminal of the high-voltage tracing circuit.

15. The ESD protection circuit as claim 14, wherein the diode comprises:
   a second N-well, disposed under the first terminal and the second terminal.

16. The ESD protection circuit as claim 14, wherein the diode comprises:
   a second P-well, disposed under the first terminal and the second terminal.

17. The ESD protection circuit as claim 16, wherein the diode further comprises:
   a second deep N-well, disposed under the second P-well.

18. The ESD protection circuit of claim 1, further comprising:
   a plurality of diodes, formed as a diode series;
   wherein the diode series is coupled between the fifth electrode terminal of the second N-type transistor and the output terminal of the high-voltage tracing circuit.

* * * * *